United States Patent
Moriwaki

(10) Patent No.: US 10,732,303 B2
(45) Date of Patent: Aug. 4, 2020

(54) IMAGING PANEL

(71) Applicant: Sharp Kabushiki Kaisha, Sakai, Osaka (JP)

(72) Inventor: Hiroyuki Moriwaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/367,312

(22) Filed: Mar. 28, 2019

(65) Prior Publication Data
US 2019/0302283 A1    Oct. 3, 2019

(30) Foreign Application Priority Data

Mar. 29, 2018 (JP) ................. 2018-064894
Mar. 26, 2019 (JP) ................. 2019-057620

(51) Int. Cl.
| | | |
|---|---|---|
| *G01T 1/20* | (2006.01) | |
| *H01L 27/146* | (2006.01) | |
| *G01T 1/208* | (2006.01) | |

(52) U.S. Cl.
CPC ............ *G01T 1/2018* (2013.01); *G01T 1/208* (2013.01); *H01L 27/14663* (2013.01)

(58) Field of Classification Search
CPC . G01T 1/2018; G01T 1/208; H01L 27/14612; H01L 27/14618; H01L 27/1462; H01L 27/14663; H01L 27/14692
See application file for complete search history.

(56) References Cited

U.S. PATENT DOCUMENTS

| | | | | |
|---|---|---|---|---|
| 2008/0302970 | A1* | 12/2008 | Fujieda | G01T 1/2018 250/370.11 |
| 2009/0250699 | A1* | 10/2009 | Okada | H01L 27/14636 257/53 |
| 2010/0224784 | A1* | 9/2010 | Homma | G01T 1/20 250/368 |
| 2012/0001282 | A1* | 1/2012 | Goto | C09K 11/628 257/429 |
| 2012/0223240 | A1* | 9/2012 | Ichimura | G01T 1/202 250/369 |
| 2012/0267539 | A1* | 10/2012 | Shinba | H01L 31/02322 250/366 |

(Continued)

FOREIGN PATENT DOCUMENTS

JP        6074111 B2       2/2017

*Primary Examiner* — Mark R Gaworecki
(74) *Attorney, Agent, or Firm* — Keating & Bennett, LLP

(57) ABSTRACT

An imaging panel includes an active matrix substrate having pixels each with a photoelectric conversion element, a scintillator provided on a surface of the active matrix substrate, a damp-proof material entirely covering the scintillator, and an adhesive layer bonding the damp-proof material to the scintillator and the active matrix substrate. The active matrix substrate includes a first flattening film that is configured as a photosensitive resin film and is provided inside and outside a pixel region, and a first inorganic film that is provided between the first flattening film and the scintillator, is overlapped in a planar view with an entire region of the scintillator, and is in contact with the first flattening film, at least outside the pixel region. At least partial region on the first inorganic film, outside the region overlapped in a planar view with the scintillator, is covered with the adhesive layer.

7 Claims, 10 Drawing Sheets

(56) References Cited

U.S. PATENT DOCUMENTS

| | | | |
|---|---|---|---|
| 2013/0313667 A1* | 11/2013 | Homma | G01T 1/2018 |
| | | | 257/428 |
| 2014/0284487 A1* | 9/2014 | Sawada | G01T 1/2002 |
| | | | 250/368 |
| 2015/0060678 A1* | 3/2015 | Watano | G01T 1/202 |
| | | | 250/367 |
| 2015/0204986 A1* | 7/2015 | Nariyuki | A61B 6/4283 |
| | | | 250/369 |
| 2015/0276940 A1* | 10/2015 | Watano | B29C 48/0011 |
| | | | 250/366 |
| 2016/0181308 A1* | 6/2016 | Ichimura | A61B 6/4233 |
| | | | 257/428 |
| 2016/0380021 A1 | 12/2016 | Ito | |
| 2017/0254908 A1* | 9/2017 | Homma | H01L 27/14618 |
| 2018/0011206 A1* | 1/2018 | Ichimura | G01T 7/00 |
| 2018/0074216 A1* | 3/2018 | Yoshida | H01L 31/032 |
| 2018/0275287 A1* | 9/2018 | Itaya | G21K 4/00 |

* cited by examiner

IMAGING PANEL

TECHNICAL FIELD

The present invention relates to an imaging panel.

BACKGROUND ART

An X-ray imaging device conventionally includes an active matrix substrate having a photoelectric conversion element provided in each pixel and connected to a switching element. Patent Literature 1 discloses a technique for preventing from moisture penetration into such an X-ray imaging device. The X-ray imaging device according to Patent Literature 1 prevents from moisture penetration through an adhesive agent bonding a damp-proof protective layer for a phosphor layer provided on a photoelectric conversion substrate and the photoelectric conversion substrate. Specifically, the photoelectric conversion substrate is provided thereon with a surface organic film made of polyimide or the like, and the surface organic film is provided with a groove that extends along the outer periphery of the phosphor layer and is filled with a resin.

CITATION LIST

Patent Literature

Patent Literature 1: JP 6074111 B1

In the Patent Literature 1, the surface organic film having damp-proof effect is provided on the photoelectric conversion substrate damp-proof effect, and the surface organic film has the groove filled with the resin, so that the adhesive agent is less likely to gather and moisture is less likely to enter the photoelectric conversion substrate. This achieves to some extent prevent from moisture penetration into the phosphor layer through the photoelectric conversion substrate. The surface organic film, which is made of polyimide or the like and has several tens of micrometers in thickness, exhibits the damp-proof effect but absorbs light in a wavelength region of scintillation light to cause deterioration in detection accuracy of the scintillation light.

SUMMARY OF INVENTION

The present invention provides a technique for preventing from moisture penetration to an imaging panel without deterioration in detection accuracy of scintillation light.

In order to achieve the object mentioned above, an imaging panel according to the present invention includes: an active matrix substrate having a pixel region provided with a plurality of pixels each including a photoelectric conversion element; a scintillator provided on a surface of the active matrix substrate and configured to covert an X-ray to scintillation light; a damp-proof material entirely covering the scintillator; and an adhesive layer bonding the damp-proof material to the scintillator and the surface of the active matrix substrate; in which the active matrix substrate includes a first flattening film provided inside and outside the pixel region and configured as a photosensitive resin film, and a first inorganic film provided between the first flattening film and the scintillator, overlapped in a planar view with an entire region provided with the scintillator, and being in contact with the first flattening film, at least outside the pixel region, and the first inorganic film has a region that is positioned outside the region overlapped in a planar view with the scintillator and is at least partially covered with the adhesive layer.

The present invention achieves preventing from moisture penetration to an imaging panel without deterioration in detection accuracy of scintillation light.

DESCRIPTION OF EMBODIMENT

Figure 1:
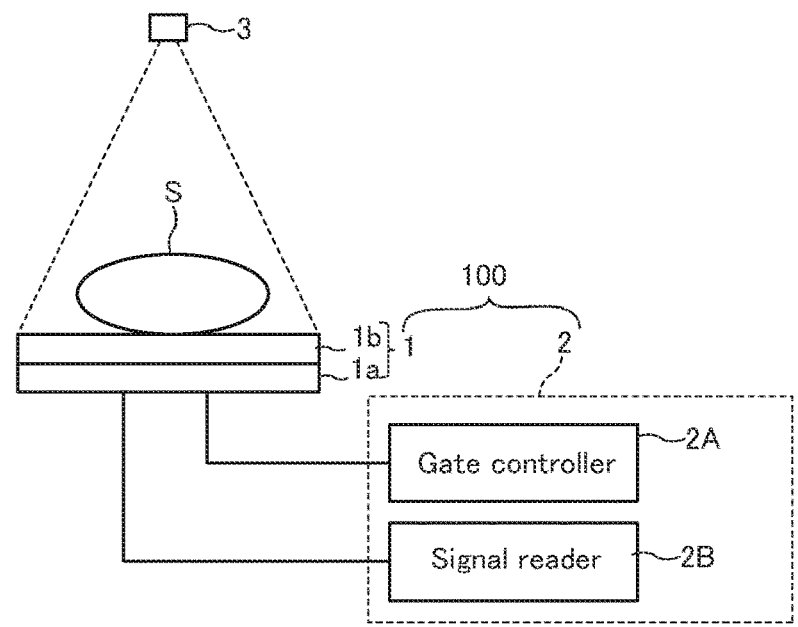
FIG. 1 is a pattern diagram of an X-ray imaging device according to a first embodiment.

An imaging panel according to an embodiment of the present invention includes: an active matrix substrate having a pixel region provided with a plurality of pixels each including a photoelectric conversion element; a scintillator provided on a surface of the active matrix substrate and configured to covert an X-ray to scintillation light; a damp-proof material entirely covering the scintillator; and an adhesive layer bonding the damp-proof material to the scintillator and the surface of the active matrix substrate; in which the active matrix substrate includes a first flattening film provided inside and outside the pixel region and configured as a photosensitive resin film, and a first inorganic film provided between the first flattening film and the scintillator, overlapped in a planar view with an entire region provided with the scintillator, and being in contact with the first flattening film, at least outside the pixel region, and the first inorganic film has a region that is positioned outside the region overlapped in a planar view with the scintillator and is at least partially covered with the adhesive layer (a first configuration).

According to the first configuration, the active matrix substrate is provided on the surface with the scintillator entirety of which is covered with the damp-proof material while the adhesive layer is interposed therebetween. The active matrix substrate includes the first flattening film configured as a photosensitive resin film and provided inside and outside the pixel region. The active matrix substrate further includes the first inorganic film that is provided between the first flattening film and the scintillator, is overlapped in a planar view with the entire region provided with the scintillator, and is in contact with the first flattening film. The first inorganic film has the region that is positioned outside the region overlapped in a planar view with the scintillator and is at least partially covered with the adhesive layer. Specifically, the scintillator is not in contact with the first flattening film and is covered with the adhesive layer and the first inorganic film. The first inorganic film and the adhesive layer are lower in hygroscopicity than the first flattening film configured as a photosensitive resin film. Even in a case where moisture enters the surface of the first flattening film, the moisture is less likely to enter the scintillator to achieve preventing from deterioration in detection accuracy due to moisture penetration.

In the first configuration, optionally, the first inorganic film has a surface that is not facing the first flattening film and is in contact with the scintillator (a second configuration).

According to the second configuration, the first inorganic film is in contact with the first flattening film and the scintillator. Even in a case where moisture enters the surface of the first flattening film, the moisture is less likely to enter the scintillator through the first inorganic film.

In the first configuration, optionally, the active matrix substrate further includes an organic film that is in contact with a surface, not facing the first flattening film, of the first inorganic film, and is in contact with the scintillator, and the organic film has an end covered with the adhesive layer (a third configuration).

According to the third configuration, the organic film is in contact with the scintillator to promote crystal growth of the scintillator. The end of the organic film is covered with the adhesive layer. Even in a case where moisture enters the surface of the first flattening film, the moisture is less likely to enter the scintillator through the organic film.

In any one of the first to third configurations, optionally, the active matrix substrate further includes a second inorganic film provided on a surface, not facing the first inorganic film, of the first flattening film, inside and outside the pixel region, and the second inorganic film is provided continuously from the pixel region to outside the pixel region (a fourth configuration).

According to the fourth configuration, the second inorganic film is provided on the surface, not facing the first inorganic film, of the first flattening film and extends continuously from the pixel region to outside the pixel region. In other words, the first flattening film is provided between the first inorganic film and the second inorganic film, and the second inorganic film is disposed continuously from the pixel region to outside the pixel region. The second inorganic film is higher in damp-proofness than the first flattening film. This configuration is less likely to allow moisture penetration into the scintillator through the first inorganic film, as well as moisture penetration into the pixel region through the second inorganic film.

In the fourth configuration, optionally, the active matrix substrate further includes a second flattening film configured as a photosensitive resin film and provided to oppose the first flattening film with the second inorganic film being interposed therebetween, inside and outside the pixel region, and the second flattening film covers the photoelectric conversion element in each of the pixels in the pixel region (a fifth configuration).

According to the fifth configuration, even in a case where moisture permeates at least the first flattening film, the moisture is less likely to enter the second flattening film through the second inorganic film and is less likely to enter the photoelectric conversion element in the pixel region.

In the fifth configuration, optionally, the active matrix substrate further includes a line provided in each of the pixels, and a metal film provided between the second inorganic film and the second flattening film, outside the pixel region, and the metal film is connected to the line via a contact hole (a sixth configuration).

According to the sixth configuration, the metal film provided between the second inorganic film and the second flattening film outside the pixel region is connected to the line provided in the pixel region via the contact hole. The line in the pixel region can thus be extended to outside the pixel region through the metal film.

In the sixth configuration, optionally, the line is provided between the second inorganic film and the second flattening film in the pixel region, and is connected to the photoelectric conversion element in a corresponding one of the pixels (a seventh configuration).

The seventh configuration enables supply of desired voltage from outside the pixel region to the photoelectric conversion element via the line.

An embodiment of the present invention will now be described in detail below with reference to the drawings. Identical or corresponding portions in the drawings will be denoted by identical reference signs and will not be described repeatedly.

(Configuration)

FIG. 1 is a pattern diagram of an X-ray imaging device including an imaging panel according to the present embodiment.

An X-ray imaging device 100 includes an imaging panel 1 having an active matrix substrate 1a and a scintillator 1b, as well as a controller 2.

The controller 2 includes a gate controller 2A and a signal reader 2B. There is provided an X-ray source 3 configured to apply X-rays to a subject S. The X-rays having been transmitted through the subject S are converted to fluorescence (hereinafter, referred to as scintillation light) by the scintillator 1b disposed on the active matrix substrate 1a. The X-ray imaging device 100 captures the scintillation light by means of the imaging panel 1 and the controller 2 to obtain an X-ray image.

Figure 2:
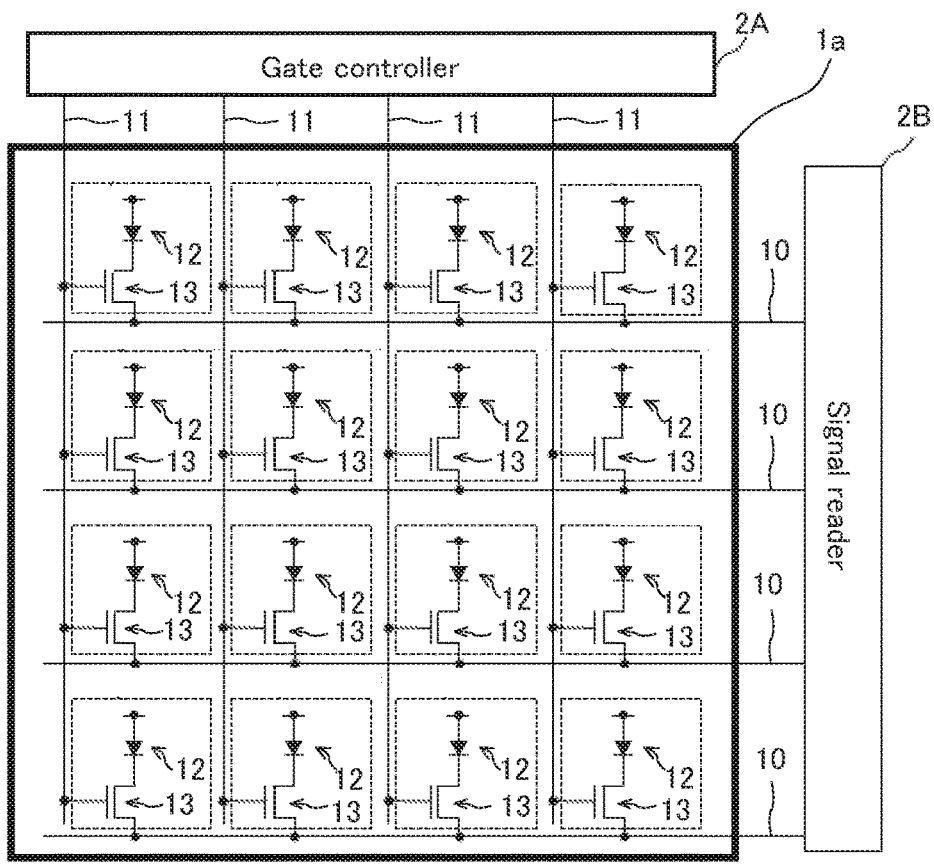
FIG. 2 is a pattern diagram showing a schematic configuration of an active matrix substrate in FIG. 1.

FIG. 2 is a pattern diagram showing a schematic configuration of the active matrix substrate 1a. As shown in FIG. 2, the active matrix substrate 1a is provided with a plurality of source lines 10 and a plurality of gate lines 11 crossing the source lines 10. The gate lines 11 are connected to the gate controller 2A whereas the source lines 10 are connected to the signal reader 2B.

The active matrix substrate 1a includes TFTs 13 positioned at intersections between the source lines 10 and the gate lines 11 and each connected to a corresponding one of the source lines 10 and a corresponding one of the gate lines 11. The source lines 10 and the gate lines 11 surround to define regions (hereinafter, referred to as pixels) that are each provided with a photodiode 12. The photodiode 12 in each of the pixels converts the scintillation light obtained through conversion from the X-rays having been transmitted through the subject S to electric charge according to quantity of the scintillation light.

The gate lines 11 provided at the active matrix substrate 1a are sequentially switched into a selected state by the gate controller 2A, and the TFT 13 connected to the gate line 11 in the selected state is brought into an ON state. When the TFT 13 comes into the ON state, a signal according to the electric charge obtained through conversion by the photodiode 12 is transmitted to the signal reader 2B via the source line 10.

Figure 3:
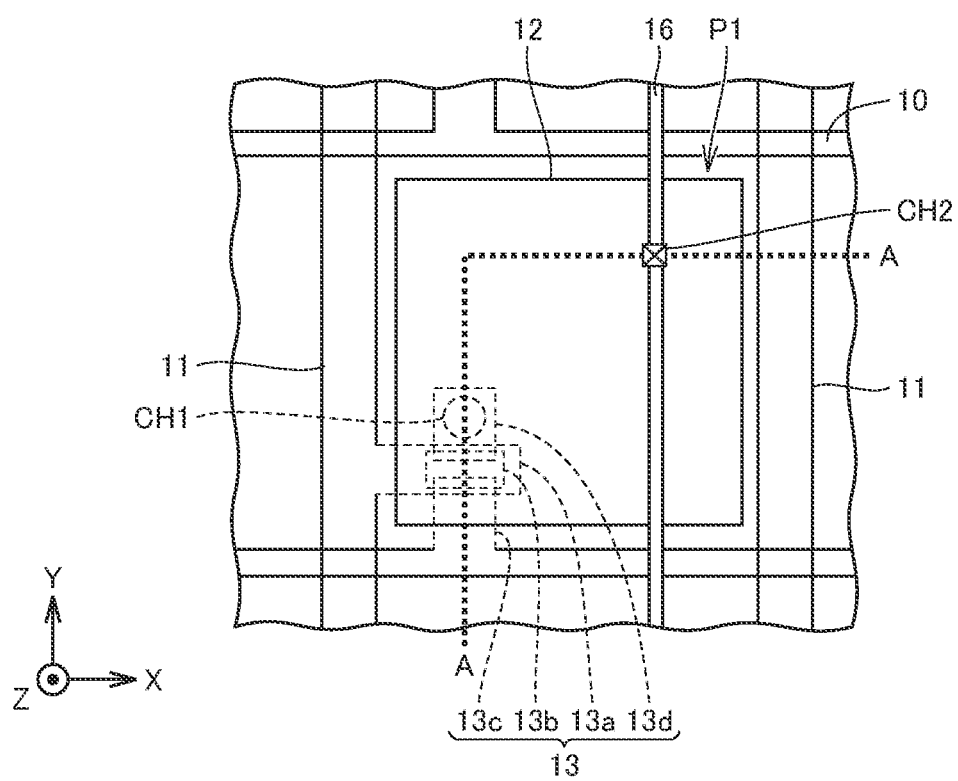
FIG. 3 is an enlarged partial plan view of a pixel part provided with a pixel on the active matrix substrate shown in FIG. 2.

FIG. 3 is an enlarged plan view of part of the pixels at the active matrix substrate 1a shown in FIG. 2.

As shown in FIG. 3, the gate lines 11 and the source lines 10 surround a pixel P1 provided with the photodiode 12 and the TFT 13.

The photodiode 12 includes a pair of electrodes and a photoelectric conversion layer provided between the pair of electrodes. The TFT 13 includes a gate electrode 13a provided integrally with the gate line 11, a semiconductor active layer 13b, a source electrode 13c provided integrally with the source line 10, and a drain electrode 13d. The drain electrode 13d and one of the electrodes of the photodiode 12 are connected to each other via a contact hole CH1.

The gate electrode 13a or the source electrode 13c may not necessarily be provided integrally with the gate line 11 or the source line 10, respectively. Alternatively, the gate electrode 13a and the gate line 11 may be disposed in different layers and be connected to each other via a contact hole. Furthermore, the source electrode 13c and the source line 10 may be disposed in different layers and be connected to each other via a contact hole. Such a configuration achieves reduction in resistance of the gate line 11 and the source line 10.

There is provided a bias line 16 overlapped with the photodiode 12 in the pixel, and the photodiode 12 and the bias line 16 are connected to each other via a contact hole CH2. The bias line 16 is configured to supply the photodiode 12 with bias voltage.

Figure 4A:
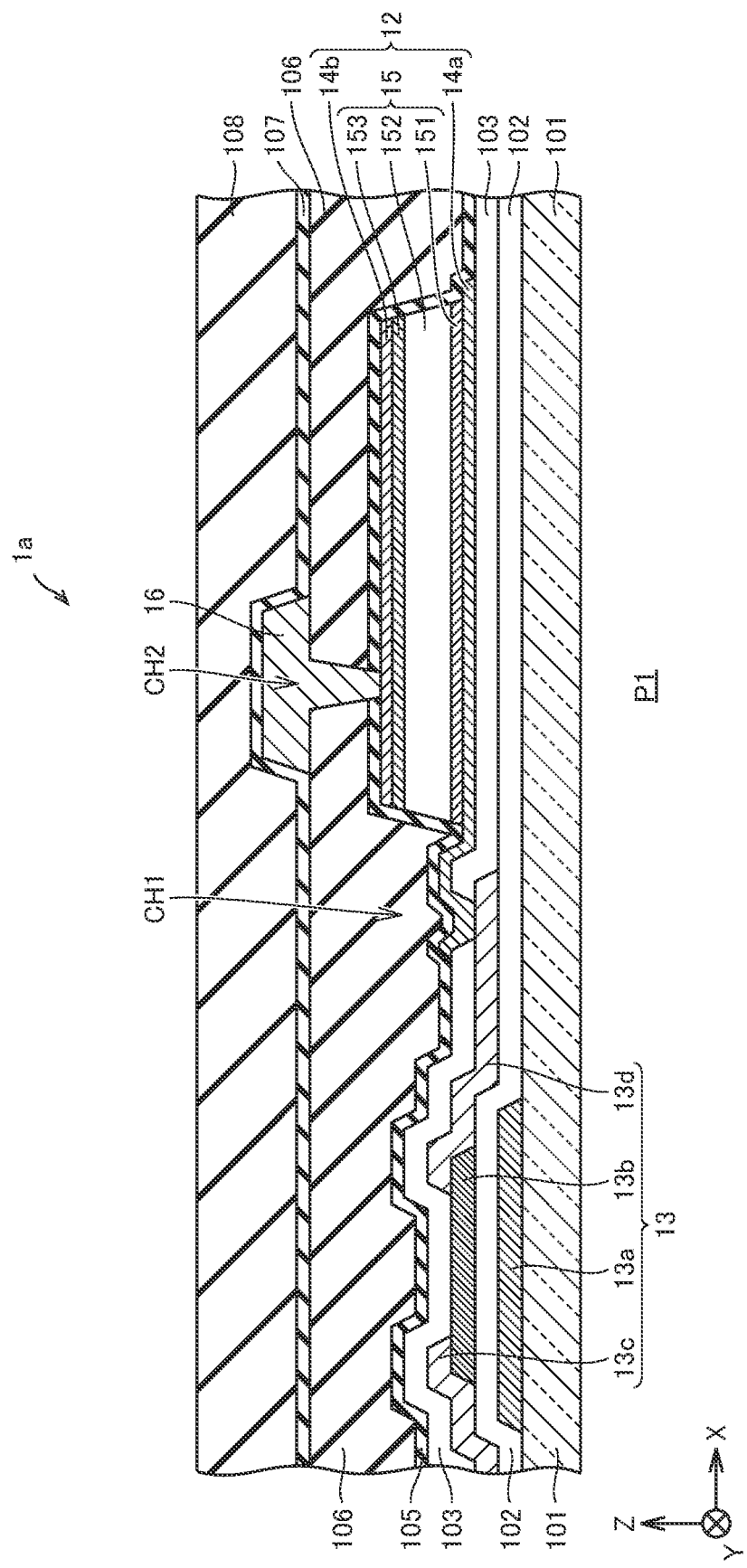
FIG. 4A is a sectional view taken along line A-A of the pixel part shown in FIG. 3.

The pixel P1 will be described below in terms of a sectional structure taken along line A-A. FIG. 4A is a sectional view taken along line A-A of the pixel P1 shown in FIG. 3. FIG. 4A shows a substrate 101 provided thereon with the gate electrode 13a integrated with the gate line 11 (see FIG. 3), and a gate insulating film 102. The substrate 101 exhibits insulation effect and is configured as a glass substrate or the like.

The gate electrode 13a and the gate line 11 according to the present example may be configured as a metal film including tungsten (W) and tantalum (Ta) layered in the mentioned order from the bottom, and having about 100 nm to 1000 nm in thickness. Each of the gate electrode 13a and the gate line 11 is not limited to such a two-layer structure, but may alternatively have a single layer or a plurality of layers including at least two layers and is not limited to the above exemplification in terms of its material and thickness.

The gate insulating film 102 covers the gate electrode 13a. The gate insulating film 102 according to the present example has a layered structure including two inorganic insulating films. The two inorganic insulating films may be made of silicon nitride ($SiN_x$) and silicon oxide ($SiO_x$) in the mentioned order from the bottom. The gate insulating film 102 is preferred to have about 100 nm to 1000 nm in thickness. The gate insulating film 102 is not limited to such a two-layer structure, but may alternatively have a single layer or a plurality of layers including at least two layers. The gate insulating film 102 is not limited to the above exemplification in terms of its material and thickness.

The gate electrode 13a is provided thereabove, while the gate insulating film 102 is interposed therebetween, with the semiconductor active layer 13b, as well as the source electrode 13c and the drain electrode 13d connected to the semiconductor active layer 13b.

The semiconductor active layer 13b is disposed in contact with the gate insulating film 102. The semiconductor active layer 13b is made of an oxide semiconductor. The oxide semiconductor is exemplified by an amorphous oxide semiconductor containing indium (In), gallium (Ga), and zinc (Zn) at predetermined ratios. The semiconductor active layer 13b is preferred to exemplarily have about 100 nm in thickness in this case. The semiconductor active layer 13b is, however, not limited to the above exemplification in terms of its material and thickness.

The source electrode 13c and the drain electrode 13d are disposed on the gate insulating film 102 and are in contact with part of the semiconductor active layer 13b. The source electrode 13c according to the present example is provided integrally with the source line 10 (see FIG. 3). The source electrode 13c and the drain electrode 13d have a layered structure including three metal films. The three metal films may be made of titanium (Ti), aluminum (Al), and titanium (Ti) in the mentioned order from the bottom. The source electrode 13c and the drain electrode 13d are preferred to exemplarily have about 100 nm to 1000 nm in thickness in this case. Each of the source electrode 13c and the drain electrode 13d is not limited to such a three-layer structure, but may alternatively have a single layer or a plurality of layers including at least two layers. Each of the source electrode 13c and the drain electrode 13d is not limited to the above exemplification in terms of its material and thickness.

The gate insulating film 102 is provided thereon with a first insulating film 103 that is overlapped with the source electrode 13c and the drain electrode 13d. The first insulating film 103 has the contact hole CH1 positioned above the drain electrode 13d. The first insulating film 103 according to the present example has a layered structure including two inorganic insulating films. The two inorganic insulating films may be made of silicon dioxide ($SiO_2$) and silicon nitride (SiN) in the mentioned order from the bottom. The first insulating film 103 is preferred to have about 100 nm to 1000 nm in thickness in this case. The first insulating film 103 is not limited to such a two-layer structure, but may alternatively have a single layer or a plurality of layers including at least two layers. The first insulating film 103 configured by a single layer is made only of silicon dioxide ($SiO_2$). The first insulating film 103 is not limited to the above exemplification in terms of its material and thickness.

The first insulating film 103 is provided thereon with one of the electrodes (hereinafter, called a lower electrode) 14a of the photodiode 12, and a second insulating film 105. The lower electrode 14a is connected to the drain electrode 13d via the contact hole CH1.

The lower electrode 14a according to the present example has a layered structure including three metal films. The three metal films may exemplarily be made of titanium (Ti), aluminum (Al), and titanium (Ti) in the mentioned order from the bottom. The lower electrode 14a is preferred to have about 100 nm to 1000 nm in thickness in this case. The lower electrode 14a is not limited to such a three-layer structure, but may alternatively have a single layer or a plurality of layers including at least two layers. The lower electrode 14a is not limited to the above exemplification in terms of its material and thickness.

The lower electrode 14a is provided thereon with a photoelectric conversion layer 15, and the lower electrode 14a and the photoelectric conversion layer 15 are connected to each other.

The photoelectric conversion layer 15 includes an n-type amorphous semiconductor layer 151, an intrinsic amorphous semiconductor layer 152, and a p-type amorphous semiconductor layer 153 layered in the mentioned order.

The n-type amorphous semiconductor layer 151 is made of amorphous silicon doped with an n-type impurity (e.g. phosphorus).

The intrinsic amorphous semiconductor layer 152 is made of intrinsic amorphous silicon. The intrinsic amorphous semiconductor layer 152 is provided in contact with the n-type amorphous semiconductor layer 151.

The p-type amorphous semiconductor layer 153 is made of amorphous silicon doped with a p-type impurity (e.g. boron). The p-type amorphous semiconductor layer 153 is provided in contact with the intrinsic amorphous semiconductor layer 152.

The n-type amorphous semiconductor layer 151, the intrinsic amorphous semiconductor layer 152, and the p-type amorphous semiconductor layer 153 according to the present example are preferred to exemplarily have about 1 nm to 100 nm, about 500 nm to 2000 nm, and about 1 nm to 100 nm in thickness, respectively. Each of the n-type amorphous semiconductor layer 151, the intrinsic amorphous semiconductor layer 152, and the p-type amorphous semiconductor layer 153 is not limited to the above exemplification in terms of its dopant and thickness.

The p-type amorphous semiconductor layer 153 is provided thereon with another one of the electrodes (hereinafter, called an upper electrode) 14b of the photodiode 12. The upper electrode 14b is exemplarily configured by a transparent conductive film made of indium tin oxide (ITO). The upper electrode 14b is preferred to exemplarily have about 10 nm to 100 nm in thickness in this case. The upper electrode 14b is, however, not limited to the above exemplification in terms of its material and thickness.

The second insulating film 105 is provided on the first insulating film 103, the lower electrode 14a, and the upper electrode 14b, and a third insulating film 106 is provided on the second insulating film 105. The contact hole CH2 is positioned on the upper electrode 14b and penetrates the second insulating film 105 and the third insulating film 106.

The second insulating film 105 according to the present example is configured as an inorganic insulating film made of silicon dioxide ($SiO_2$) or silicon nitride (SiN). The second insulating film 105 is preferred to exemplarily have about 100 nm to 1000 nm in thickness in this case. The second insulating film 105 is, however, not limited to the above exemplification in terms of its material and thickness.

The third insulating film 106 (the second flattening film) is preferred to be configured as a flattening film made of a photosensitive resin and exemplarily have about 1.0 µm to 3.0 µm in thickness. The third insulating film 106 is, however, not limited to the above exemplification in terms of its material and thickness.

The third insulating film 106 is provided thereon with the bias line 16 that is connected to the upper electrode 14b via the contact hole CH2. The bias line 16 is connected to the controller 2 (see FIG. 1). The bias line 16 applies, to the upper electrode 14b, bias voltage received from the controller 2.

The bias line 16 according to the present example has a layered structure including a metal layer as a lower layer and a transparent conductive layer as an upper layer. The metal layer may include layered films exemplarily made of titanium (Ti), aluminum (Al), and titanium (Ti), and the transparent conductive layer may be exemplarily made of ITO or the like. The bias line 16 is preferred to have about 100 nm to 1000 nm in thickness. The bias line 16 may have a single layer or a plurality of layers including at least two layers. The bias line 16 is not limited to the above exemplification in terms of its material and thickness.

The third insulating film 106 is provided thereon with a fourth insulating film 107 (the second inorganic film) that covers the bias line 16. The fourth insulating film 107 according to the present example may be configured as an inorganic insulating film made of silicon nitride ($SiN_x$), and is preferred to exemplarily have about 100 nm to 1000 nm in thickness. The fourth insulating film 107 is not limited to such a single layer structure including the single inorganic insulating film, but may alternatively have a layered structure including a plurality of inorganic insulating films. The fourth insulating film 107 is not limited to the above exemplification in terms of its material and thickness.

The fourth insulating film 107 is covered with a fifth insulating film 108 (the first flattening film). The fifth insulating film 108 is preferred to be configured as a flattening film made of a photosensitive resin and exemplarily have about 1.0 µm to 10.0 µm in thickness. The fifth insulating film 108 is, however, not limited to the above exemplification in terms of its material and thickness.

The active matrix substrate 1a has the sectional structure described above in the single pixel P1.

Figure 4B:
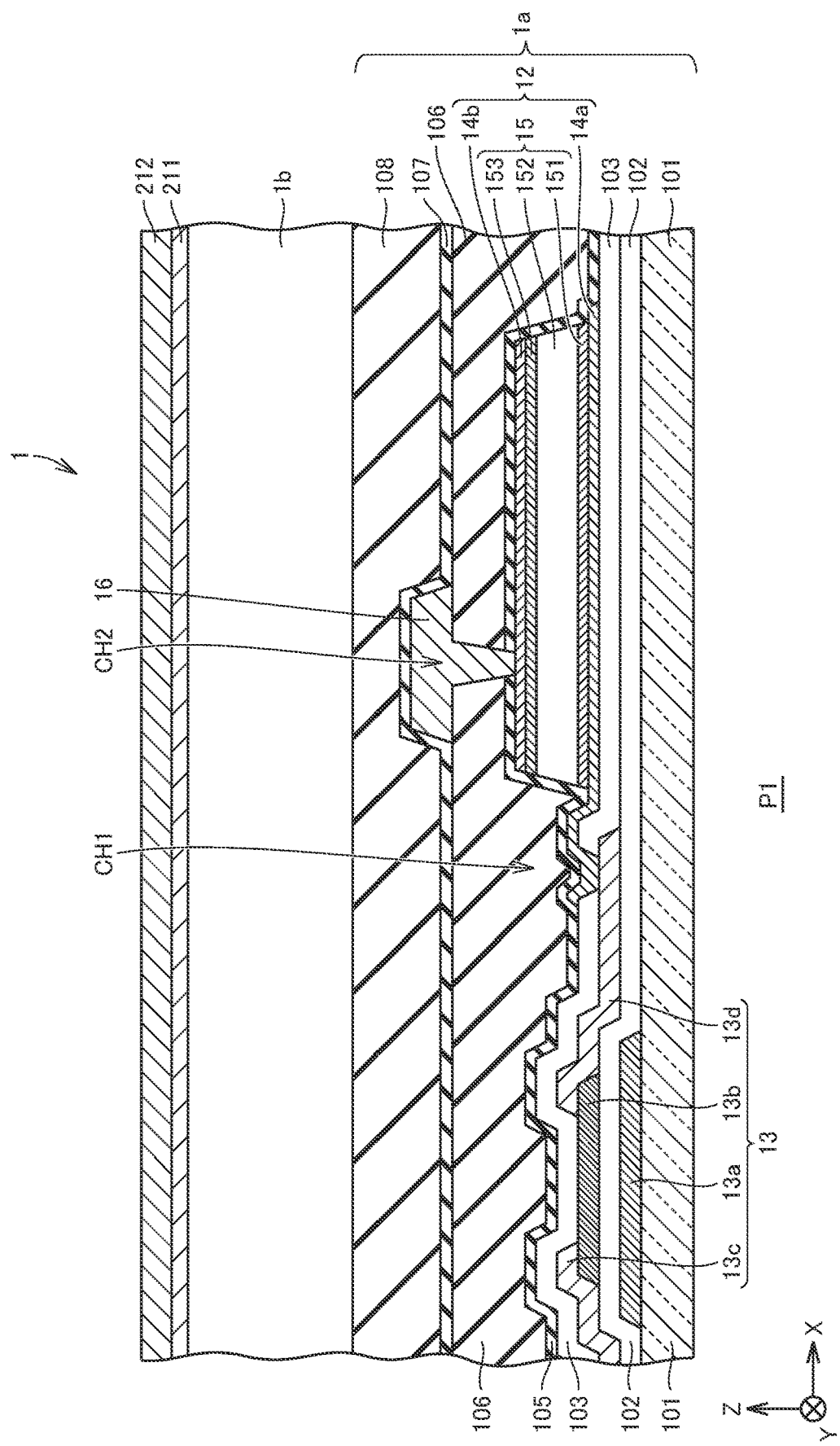
FIG. 4B is a sectional view of a pixel part in an imaging panel shown in FIG. 1.

The scintillator 1b is provided on the active matrix substrate 1a in the imaging panel 1. FIG. 4B is a sectional view showing a sectional structure of a pixel region in the imaging panel 1. As shown in FIG. 4B, the active matrix substrate 1a is provided thereon with the scintillator 1b covering the fifth insulating film 108, and there is provided a damp-proof material 212 that covers the scintillator 1b and is bonded to the scintillator 1b by means of an adhesive layer 211. The adhesive layer 211 is made of a photosetting resin, a thermosetting resin, a hot melt resin, or the like, and exhibits damp-proof effect. The damp-proof material 212 is exemplarily configured by an organic film having damp-proofness.

Figure 5A:
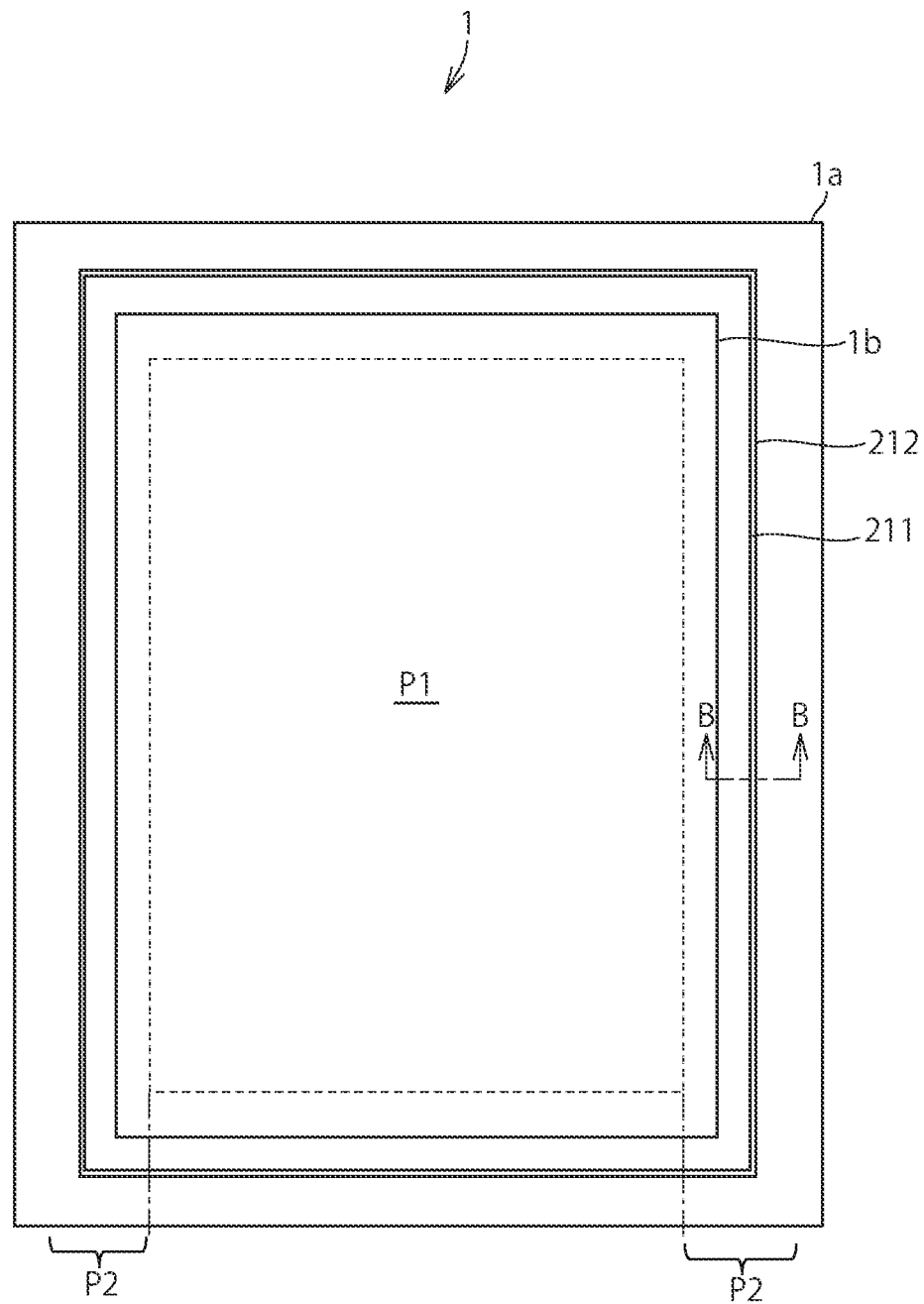
FIG. 5A is a schematic plan view of the imaging panel shown in FIG. 1.

Described next is a structure outside the entire pixel region in the imaging panel 1, in other words, a structure of an end region in the imaging panel 1. FIG. 5A is a schematic plan view of the imaging panel 1, and FIG. 5B is a sectional view taken along line B-B indicated in FIG. 5A and showing an enlarged section of part of an end region P2 along a side of the active matrix substrate 1a.

Figure 5B:
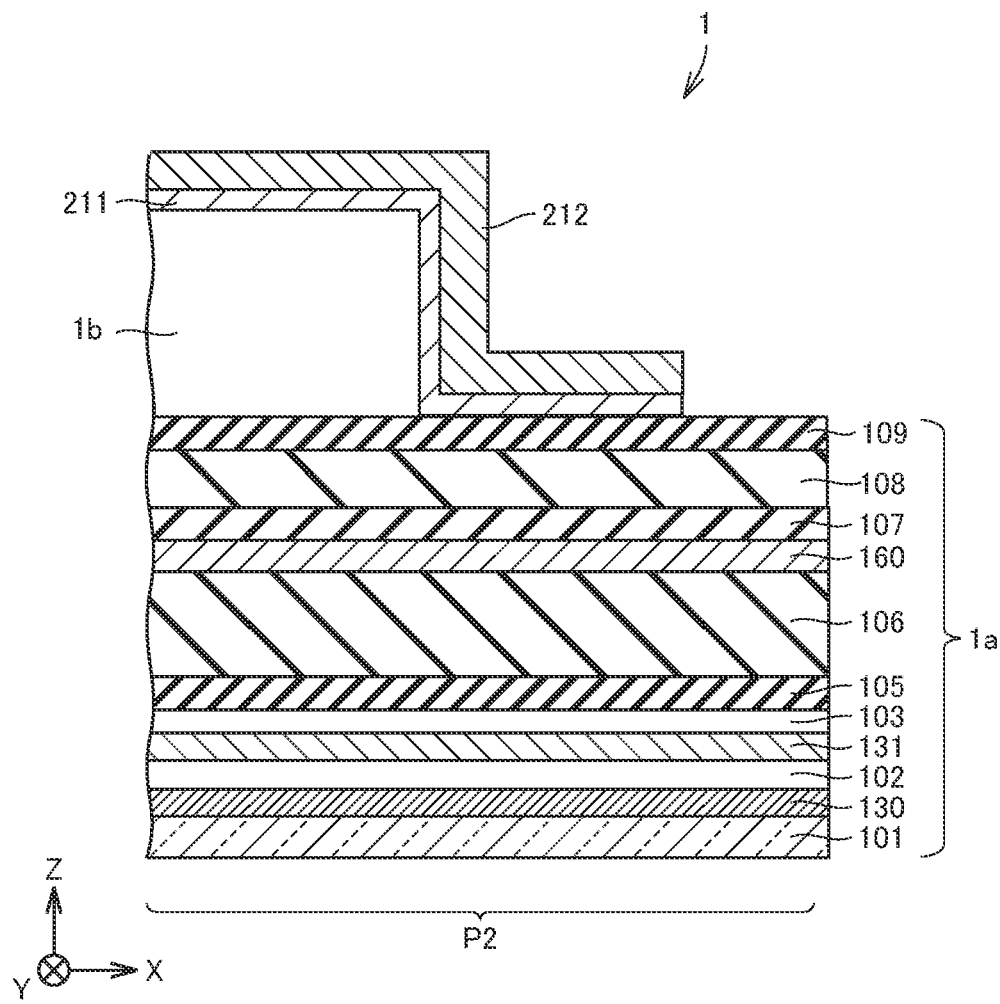
FIG. 5B is a sectional view taken along line B-B indicated in FIG. 5A.

In FIGS. 5A and 5B, components identical to those shown in FIG. 4B are denoted by identical reference signs. The end region P2 will be specifically described below in terms of its structure. FIG. 5B shows the section of the end region along one of the sides of the active matrix substrate 1a for convenience. The remaining three sides are each assumed to have an end region configured similarly to that shown in FIG. 5B.

As shown in FIG. 5B, the end region P2 includes a gate layer 130 provided on the substrate 101 to be disposed in a layer including the gate electrode 13a, be made of the material same as that for the gate electrode 13a, and be provided thereon with the gate insulating film 102. The gate insulating film 102 is provided thereon with a source layer 131 that is disposed in a layer including the source electrode 13c and the drain electrode 13d, and is made of the material same as that for the source electrode 13c and the drain electrode 13d.

The gate layer 130 may be connected, via a contact hole (not shown), to a gate terminal (not shown) provided outside the pixel region of the active matrix substrate 1a. The source layer 131 may be connected, via a contact hole (not shown), to a source terminal (not shown) provided outside the pixel region of the active matrix substrate 1a.

The first insulating film 103 is provided on the source layer 131, the second insulating film 105 is provided on the first insulating film 103, and the third insulating film 106 is provided on the second insulating film 105.

The third insulating film 106 is provided thereon with a bias line layer 160 that is disposed in a layer including the bias line 16 and is made of the material same as that for the bias line 16.

The bias line layer 160 is connected, via a contact hole (not shown), to a terminal (not shown) provided outside the pixel region of the active matrix substrate 1a. The bias line 16 and the bias line layer 160 are connected to each other via a contact hole (not shown) provided inside or outside the pixel region, and bias voltage received by the terminal is supplied to the bias line 16 via the bias line layer 160.

Each of the gate layer 130, the source layer 131, and the bias line layer 160 may be provided continuously from the pixel P1 to the end region P2. Outside the pixel P1, a metal film provided in a layer not including the gate line 11, the source line 10, or the bias line 16 may be connected to each of these lines via a contact hole.

The fourth insulating film 107 is provided on the bias line layer 160. The fifth insulating film 108 is provided on the fourth insulating film 107. The fifth insulating film 108 is provided thereon with a sixth insulating film 109 (the first inorganic film) that covers the fifth insulating film 108.

The sixth insulating film 109 is configured as an inorganic insulating film made of silicon dioxide ($SiO_2$) or silicon nitride (SiN). The sixth insulating film 109 may have a single layer structure including the single inorganic insulating film, or a layered structure including a plurality of inorganic insulating films.

Figure 6:
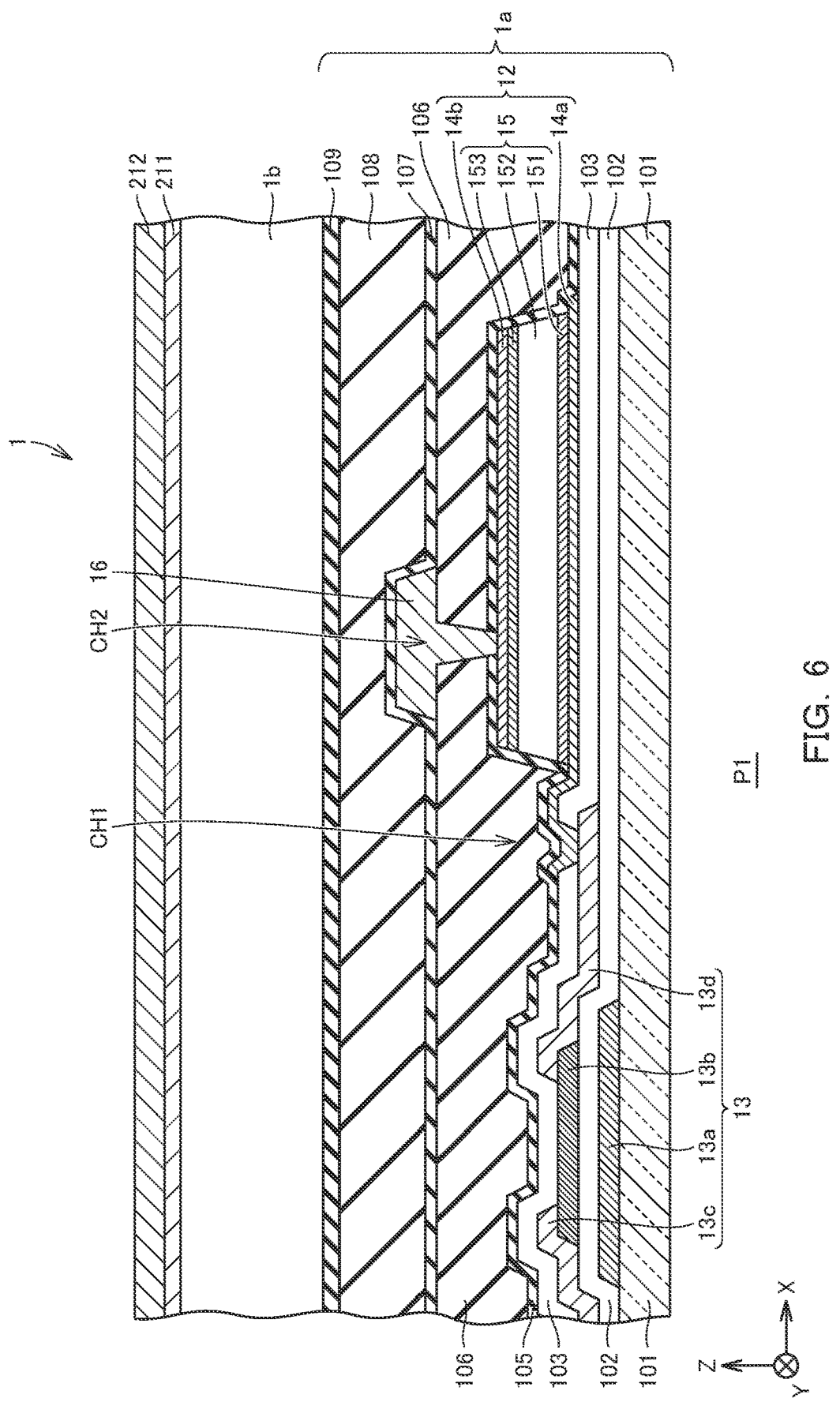
FIG. 6 is a sectional view of the pixel part provided with a sixth insulating film in the imaging panel shown in FIG. 4B.

The sixth insulating film 109 according to the present example is not provided in the pixel P1 but is provided only in the end region P2 to cover the surface of the fifth insulating film 108 in the end region P2. As shown in FIG. 6, the sixth insulating film 109 may alternatively be provided to cover the fifth insulating film 108 also in the pixel P1, so as to be disposed continuously from the pixel P1 to the end region P2.

The fourth insulating film 107 covering the bias line 16 in the pixel P1 is likely to be thinner than the fourth insulating film 107 on the third insulating film 106 or be lost partially. The bias line 16 may be corroded by any moisture entering the fifth insulating film 108, in which case the moisture is likely to enter the photodiode 12 or the TFT 13 through a corroded portion of the bias line 16 or a lost portion of the fourth insulating film 107. The sixth insulating film 109 covers the surface of the fifth insulating film 108 in the pixel P1 as shown in FIG. 6 to be less likely to allow moisture penetration to the fifth insulating film 108. Even in such a case where the fourth insulating film 107 covering the bias line 16 has a thinner portion or a lost portion, this configuration prevents from corrosion of the bias line 16 and moisture penetration to the photodiode 12 and the TFT 13.

The sixth insulating film 109 is provided thereon with the scintillator 1b that is provided thereon with the damp-proof material 212 bonded to the scintillator 1b by means of the adhesive layer 211.

As shown in FIG. 5B, in the end region P2, the sixth insulating film 109 is provided between the fifth insulating film 108 and the scintillator 1b to be overlapped in a planar view with the scintillator 1b, the adhesive layer 211, and the damp-proof material 212. The sixth insulating film 109 configured as an inorganic insulating film is lower in hygroscopicity than the fifth insulating film 108 configured as an organic insulating film. In view of this, the sixth insulating film 109 is provided to be overlapped with the scintillator 1b, the adhesive layer 211, and the damp-proof material 212. This configuration is less likely to allow moisture penetration into the scintillator 1b through the sixth insulating film 109 even in a case where moisture enters an end of the fifth insulating film 108.

The end region P2 includes the fourth insulating film 107 configured as an inorganic insulating film and disposed on the bias line layer 160. Even in a case where moisture enters the end of the fifth insulating film 108, the moisture is less likely to permeate, through the fourth insulating film 107, the third insulating film 106 disposed below the fourth insulating film 107. This configuration prevents from moisture penetration through the photodiode 12 and the TFT 13 provided in the pixel P1.

(Operation of X-Ray Imaging Device 100)

The X-ray imaging device 100 shown in FIG. 1 will be described below in terms of its operation. The X-ray source 3 initially emits X-rays. The controller 2 applies predetermined voltage (bias voltage) to the bias line 16 (see FIG. 3) in this case. The X-rays emitted from the X-ray source 3 are transmitted through the subject S and enter the scintillator 1b. The X-rays having entered the scintillator 1b are converted to fluorescence (scintillation light) that subsequently enters the active matrix substrate 1a.

When the scintillation light enters the photodiode 12 provided in each of the pixels of the active matrix substrate 1a, the photodiode 12 converts the scintillation light to electric charge according to quantity of the scintillation light. When the TFT 13 (see FIG. 3 and the like) is in the ON state in accordance with gate voltage (positive voltage) transmitted from the gate controller 2A via the gate line 11, the signal reader 2B (see FIG. 2 and the like) reads, via the source line 10, a signal according to the electric charge obtained through conversion by the photodiode 12. The controller 2 then generates an X-ray image according to the read signal.

The embodiment of the present invention described above is merely exemplified for implementation of the present invention. The present invention should not be limited to the embodiment described above, and can be implemented with appropriate modifications to the above embodiment without departing from the spirit of the present invention.

Figure 7A:
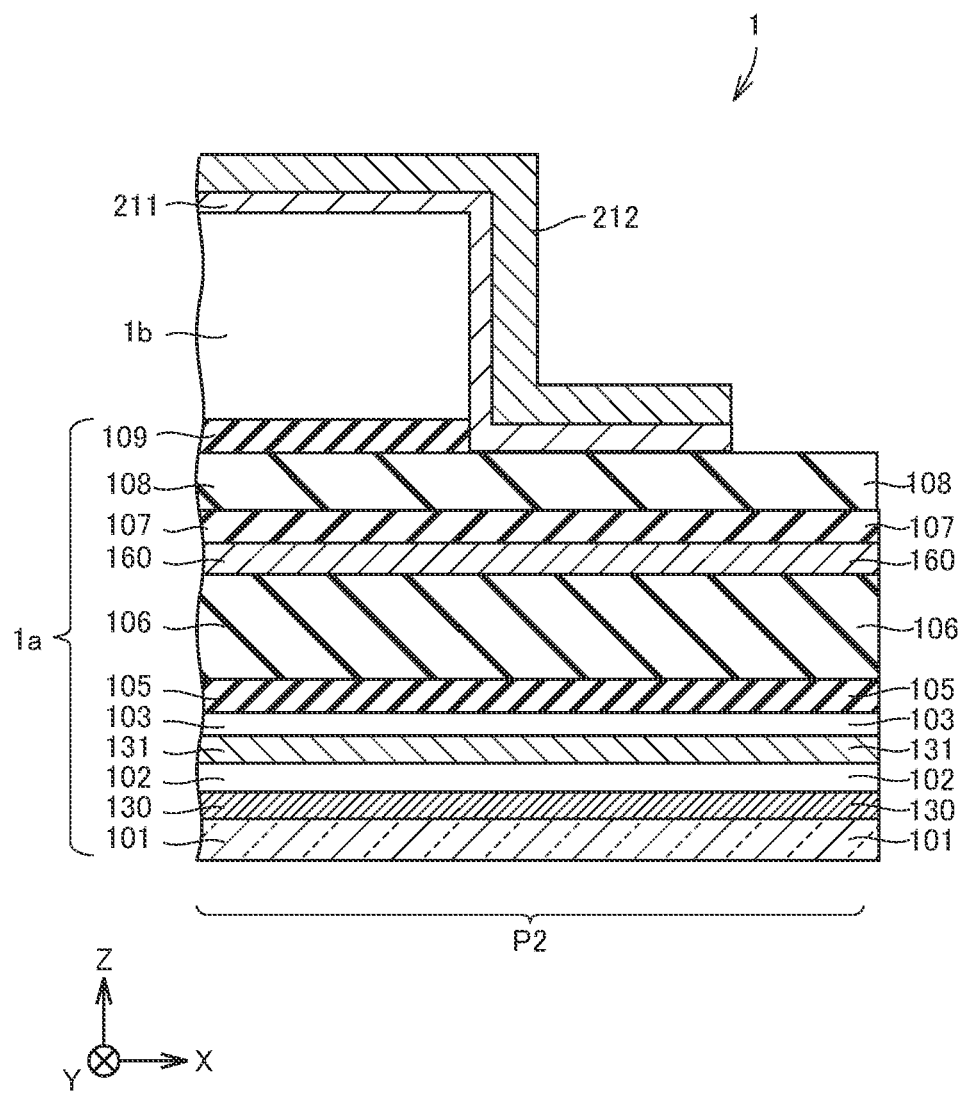
FIG. 7A is a sectional view of an end region in an imaging panel according to a modification example (1)

(1) The end region P2 according to the above embodiment includes the sixth insulating film 109 entirely covering the fifth insulating film 108. The sixth insulating film 109 may alternatively be provided only in a region overlapped with the scintillator 1b on the fifth insulating film 108, as shown in FIG. 7A.

Figure 7B:
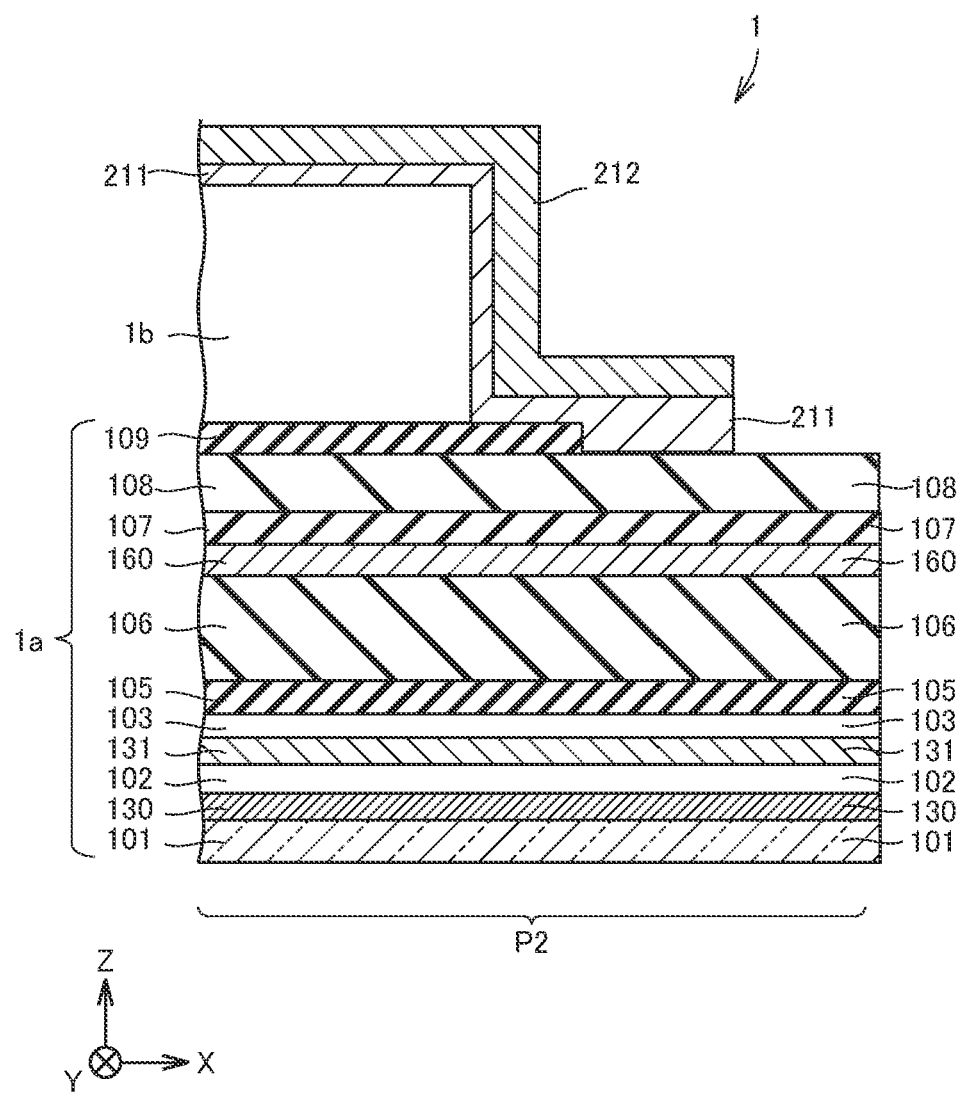
FIG. 7B is a sectional view of the end region in the imaging panel according to the modification example (1), including the sixth insulating film disposed differently from FIG. 7A.

Such a configuration is also less likely to allow moisture penetration into the scintillator 1b through the sixth insulating film 109 in a case where moisture enters the surface of the fifth insulating film 108. The sixth insulating film 109 may still alternatively be disposed to have an end positioned between a boundary of the scintillator 1b and a boundary of the adhesive layer 211, as shown in FIG. 7B. In other words, the end of the sixth insulating film 109 may be positioned outside a boundary of a scintillator region provided with the scintillator 1b.

(2) In the above embodiment, the metal layers, namely, the bias line layer 160, the source layer 131, and the gate layer 130 shown in FIG. 5B and the like, each have a lateral end disposed at a substantially identical position with a lateral end of the substrate 101, so that the lateral ends of the metal layers are not covered with any insulating film. The metal layers in this configuration are exposed to outside air and may thus be corroded to allow moisture penetration into the active matrix substrate 1a. In view of this, the lateral ends of the metal layers may alternatively be disposed inside the lateral end of the substrate 101 so as to be each covered with an insulating film provided thereabove. In this case, the fourth insulating film 107 covers the entire surface as well as the lateral end of the bias line layer 160, the first insulating film 103 covers the entire surface as well as the lateral end of the source layer 131, and the gate insulating film 102 covers the entire surface as well as the lateral end of the gate layer 130.

Figure 8:
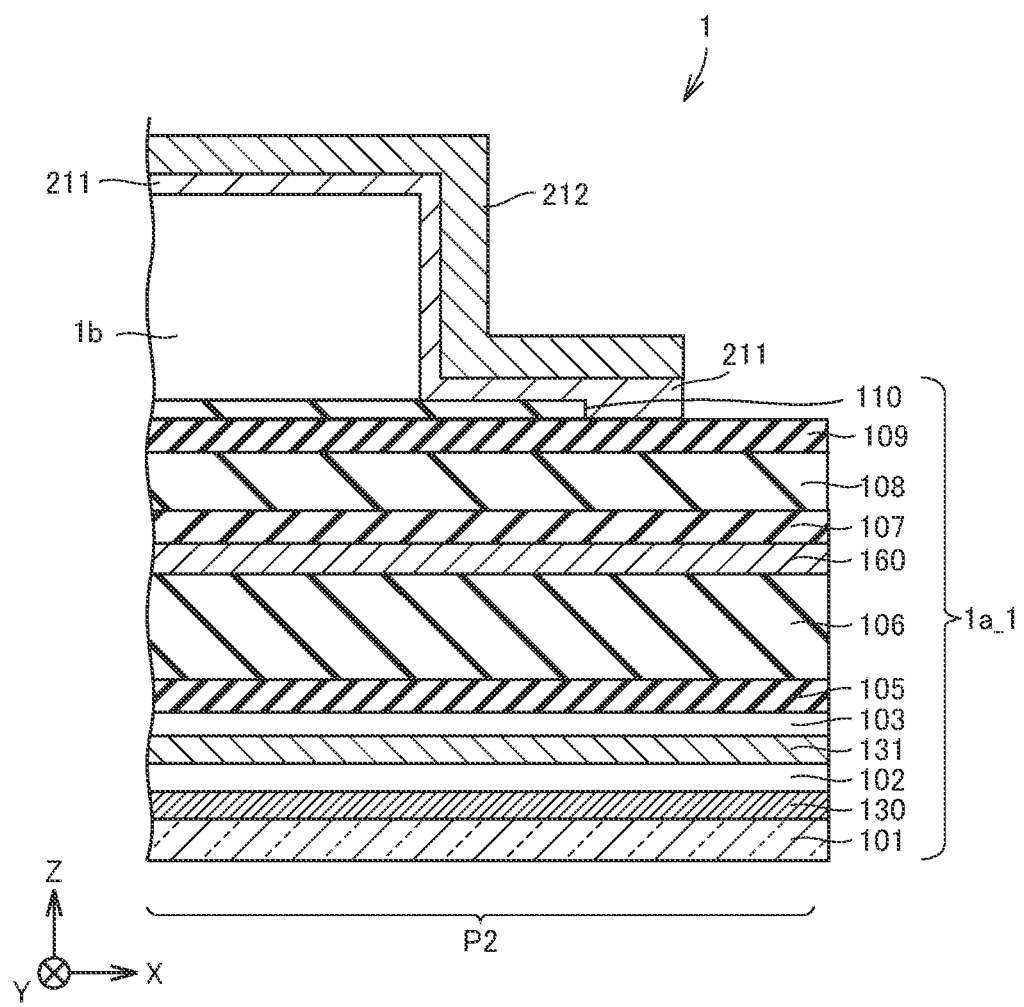
FIG. 8 is a sectional view of an end region in an imaging panel according to a modification example (3).

(3) The above embodiment exemplifies the case where the sixth insulating film 109 is in contact with the scintillator 1*b* and the fifth insulating film 108. As shown in FIG. 8, the present modification example provides an active matrix substrate 1*a*_1 further including a seventh insulating film 110 (the organic film) made of a photosensitive resin material and disposed between the scintillator 1*b* and the sixth insulating film 109. Although this figure shows the end region P2, the seventh insulating film 110 is provided between the sixth insulating film 109 and the scintillator 1*b* also in the pixel P1. The seventh insulating film 110 is in contact with the scintillator 1*b* in the pixel P1 as well as in the end region P2. This configuration promotes crystal growth of the scintillator 1*b* to improve X-ray detection accuracy.

(4) The fifth insulating film 108 and the third insulating film 106 according to the embodiment or the modification example described above may be made of a positive or negative photosensitive resin material.

The invention claimed is:

1. An imaging panel comprising:
an active matrix substrate having a pixel region provided with a plurality of pixels each including a photoelectric conversion element;
a scintillator provided on a surface of the active matrix substrate and configured to convert an X-ray to scintillation light;
a damp-proof material entirely covering the scintillator; and
an adhesive layer bonding the damp-proof material to the scintillator and the surface of the active matrix substrate; wherein
the active matrix substrate includes
a first flattening film provided inside and outside the pixel region and configured as a photosensitive resin film, and
a first inorganic film provided between the first flattening film and the scintillator, overlapped in a planar view with an entire region provided with the scintillator, and being in contact with the first flattening film, at least outside the pixel region, and
the first inorganic film has a region that is positioned outside the region overlapped in a planar view with the scintillator and is at least partially covered with the adhesive layer.

2. The imaging panel according to claim 1, wherein the first inorganic film has a surface that is not facing the first flattening film and is in contact with the scintillator.

3. The imaging panel according to claim 1, wherein
the active matrix substrate further includes an organic film that is in contact with a surface, not facing the first flattening film, of the first inorganic film, and is in contact with the scintillator, and
the organic film has an end covered with the adhesive layer.

4. The imaging panel according to claim 1, wherein
the active matrix substrate further includes a second inorganic film provided on a surface, not facing the first flattening film, of the first flattening film, inside and outside the pixel region, and
the second inorganic film is provided continuously from the pixel region to outside the pixel region.

5. The imaging panel according to claim 4, wherein
the active matrix substrate further includes a second flattening film configured as a photosensitive resin film and provided to oppose the first flattening film with the second inorganic film being interposed therebetween, inside and outside the pixel region, and
the second flattening film covers the photoelectric conversion element in each of the pixels in the pixel region.

6. The imaging panel according to claim 5, wherein the active matrix substrate further includes
a line provided in each of the pixels, and
a metal film provided between the second inorganic film and the second flattening film, outside the pixel region, and
the metal film is connected to the line via a contact hole.

7. The imaging panel according to claim 6, wherein the line is provided between the second inorganic film and the second flattening film in the pixel region, and is connected to the photoelectric conversion element in a corresponding one of the pixels.

\* \* \* \* \*